(12) United States Patent
Lee (10) Patent No.: US 7,868,330 B2
(45) Date of Patent: Jan. 11, 2011

(54) ORGANIC ELECTRO-LUMINESCENCE DISPLAY DEVICE AND FABRICATING METHOD THEREOF

(75) Inventor: Chun Tak Lee, Gyeongsangbuk-do (KR)

(73) Assignee: LG Electronics Inc., Seoul (KR)

( * ) Notice: Subject to any disclaimer, the term of this patent is extended or adjusted under 35 U.S.C. 154(b) by 455 days.

(21) Appl. No.: 11/258,168

(22) Filed: Oct. 26, 2005

(65) Prior Publication Data
US 2006/0091381 A1    May 4, 2006

(30) Foreign Application Priority Data
Oct. 29, 2004    (KR)    .................. P10-2004-0087215

(51) Int. Cl.
*H01L 29/10*     (2006.01)
*H01L 31/00*     (2006.01)

(52) U.S. Cl. .................. 257/72; 257/59; 257/E51.019; 257/E21.045; 313/500; 349/11; 438/29; 438/34

(58) Field of Classification Search .................. 257/59, 257/72, E51.019, E21.045; 438/34, 29, 35, 438/66; 313/500; 349/11
See application file for complete search history.

(56) References Cited

U.S. PATENT DOCUMENTS

| | | | |
|---|---|---|---|
| 6,037,005 A * | 3/2000 | Moshrefzadeh et al. | ..... 427/286 |
| 6,133,581 A | 10/2000 | Terao et al. | |
| 6,939,732 B2 * | 9/2005 | Birnstock et al. | ............. 438/22 |
| 2001/0024083 A1 | 9/2001 | Yamazaki et al. | |
| 2001/0026126 A1 | 10/2001 | Nakaya et al. | |
| 2003/0011304 A1 * | 1/2003 | Duineveld et al. | .......... 313/506 |
| 2004/0140760 A1 | 7/2004 | Chang et al. | |
| 2005/0116629 A1 | 6/2005 | Takamura et al. | |
| 2007/0160938 A1 | 7/2007 | Takamura et al. | |

FOREIGN PATENT DOCUMENTS

| | | |
|---|---|---|
| EP | 0 891 122 A1 | 1/1999 |
| EP | 1 107 335 A2 | 6/2001 |
| GB | 2 329 506 A | 3/1999 |
| JP | 2001-345185 A | 12/2001 |
| WO | WO-03/075616 A1 | 9/2003 |

* cited by examiner

*Primary Examiner*—Asok K Sarkar
(74) *Attorney, Agent, or Firm*—Birch, Stewart, Kolasch & Birch, LLP (57) ABSTRACT

An organic electro luminescence display device having a plurality of anode electrodes which are disposed in parallel to a substrate, formed of a transparent conductive material and electrically separated from each other; a first conductive light shielding pattern formed along a first side of each of the anode electrodes; and a second conductive light shielding pattern formed along a second side of each of the anode electrodes.

6 Claims, 14 Drawing Sheets

ORGANIC ELECTRO-LUMINESCENCE DISPLAY DEVICE AND FABRICATING METHOD THEREOF

This application claims the benefit of the Korean Patent Application No. P2004-87215 filed on Oct. 29, 2004, which is hereby incorporated by reference.

BACKGROUND OF THE INVENTION

1. Field of the Invention

The present invention relates to an organic electro luminescence display device and a fabricating method thereof, and more particularly to an organic electro luminescence display device that is adaptive for improving contrast ratio as well as improving the conductivity of an anode electrode, and a fabricating method thereof.

2. Description of the Related Art

Recently, there have been developed a variety of flat panel display devices that can reduce their weight and size, which are a disadvantage of a cathode ray tube CRT. The flat panel display device includes a liquid crystal display LCD, a field emission display FED, a plasma display panel PDP and an electro luminescence EL display device.

The PDP is relatively simple in its structure and fabricating process, thus it is advantageous in being made into a large size screen but there is a disadvantage in that its light emitting efficiency and brightness is low and its power consumption is high. The LCD is mainly used for a display device of a notebook computer so that its demand increases, but there is a disadvantage in that it is difficult to be made into a large size screen and its power consumption is high. Further, the LCD has a disadvantage in that there is high light loss by optical display devices such as polarizing filter, prism sheet, diffusion sheet and so on and its viewing angle is narrow. In comparison with this, the EL display device is largely divided into an inorganic EL and an organic EL and has an advantage in that the response speed is high and the light emitting efficiency, brightness and the viewing angle is high. Further, the organic EL display device might be able to display a picture with a high brightness of tens of thousands [cd/m$^2$] at a voltage of about 10[V].

Figure 1:
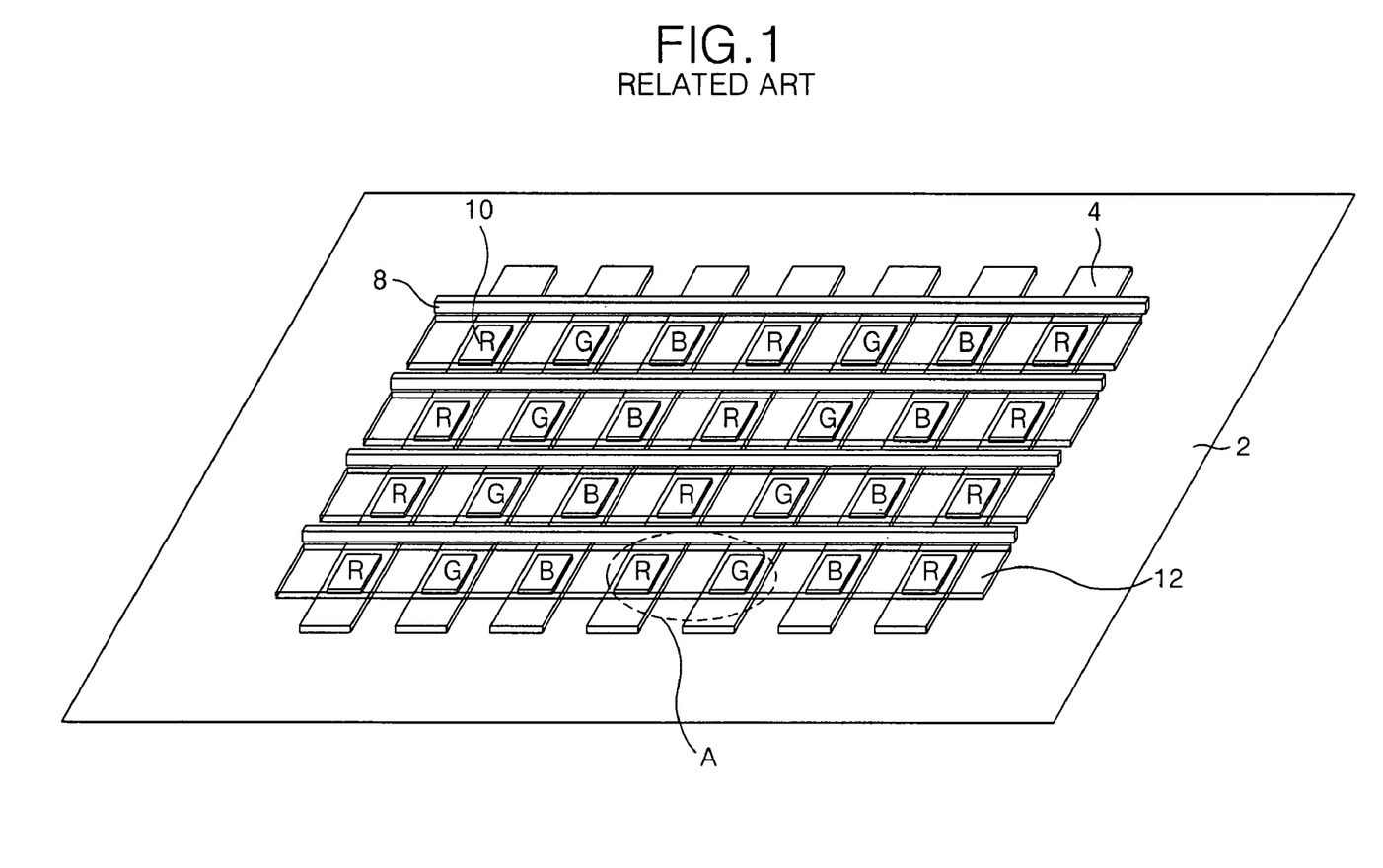
FIG. 1 a perspective view representing a related art organic electro luminescence display device.
Figure 2:
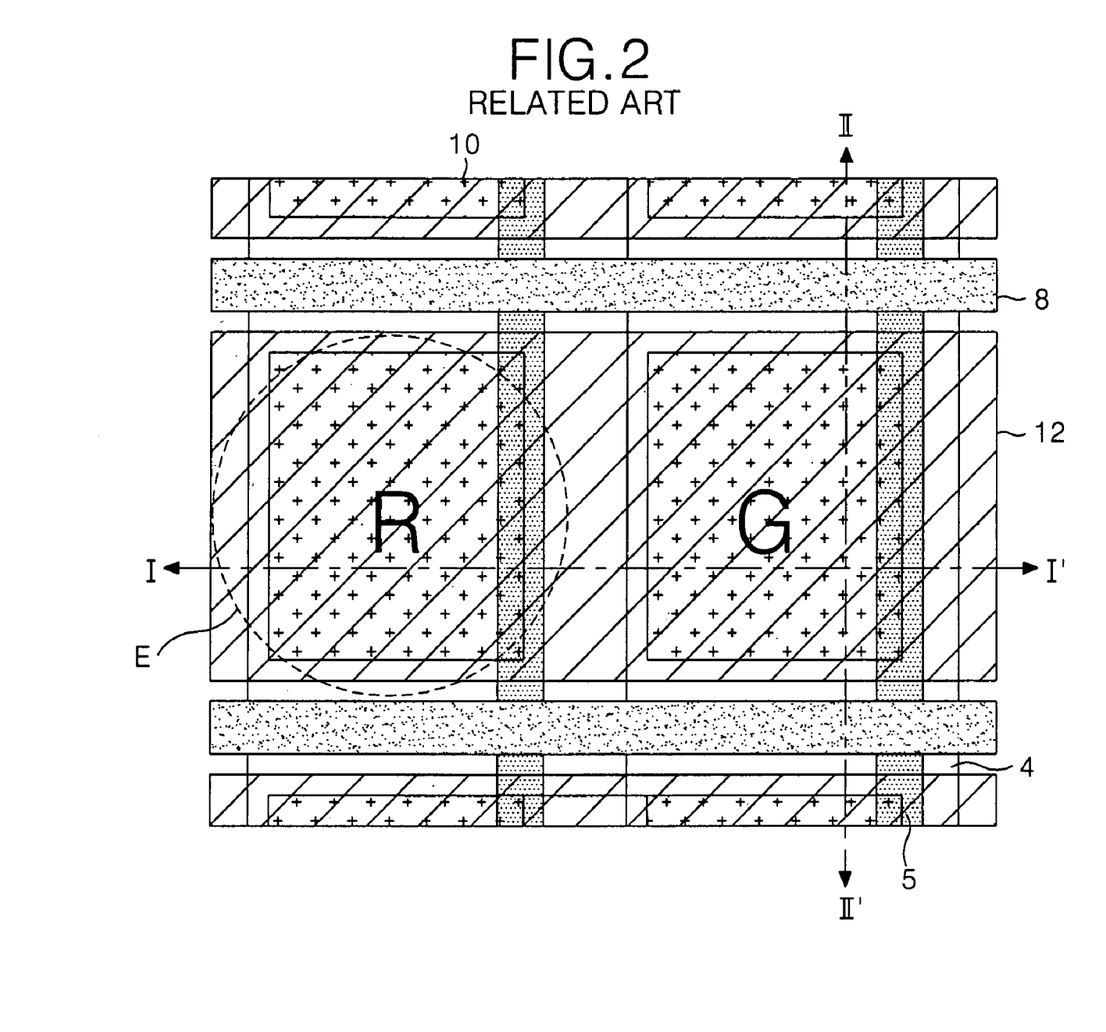
FIG. 2 is a diagram specifically representing an A area of in FIG. 1.
Figure 3:
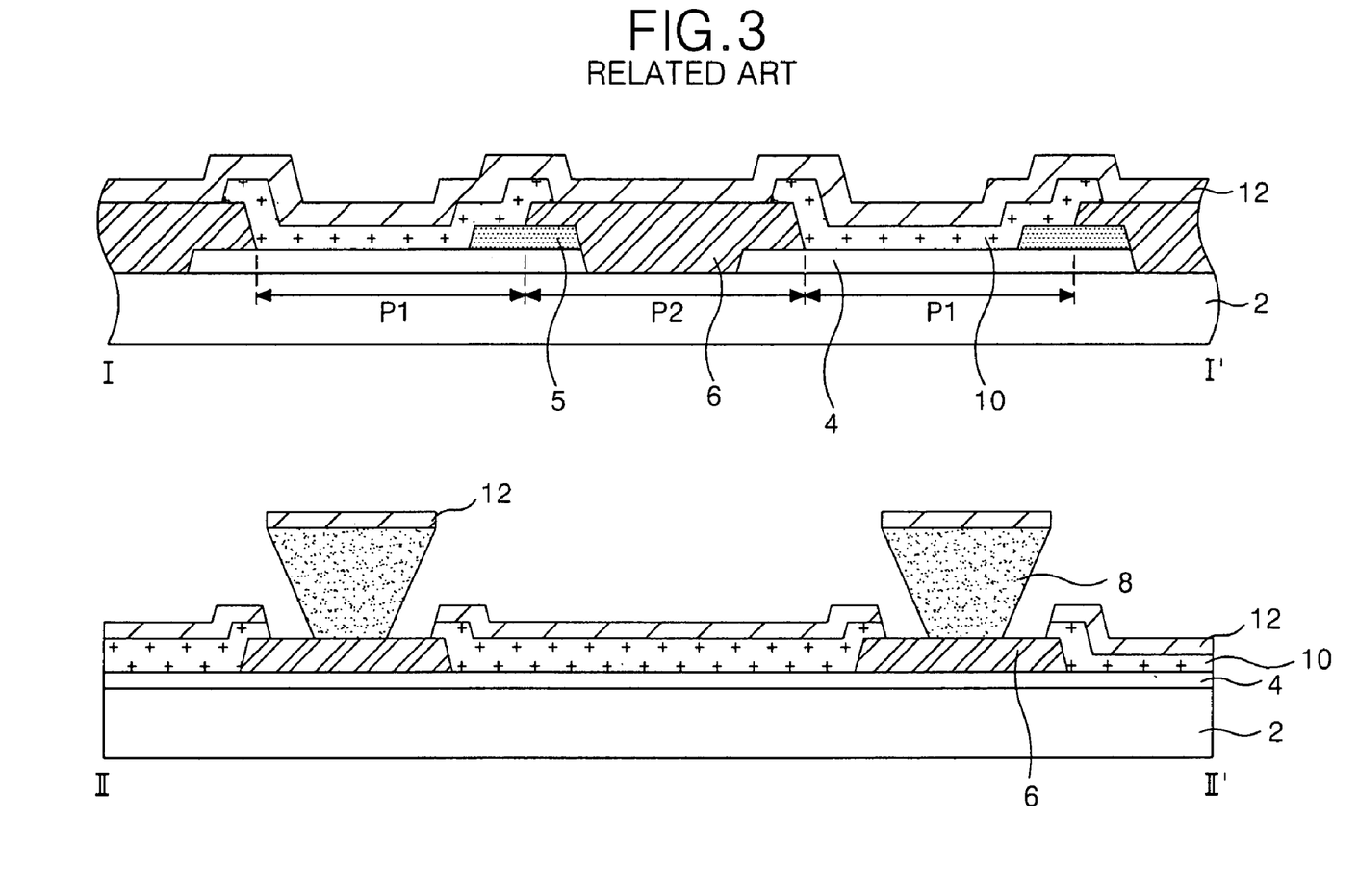
FIG. 3 is a sectional diagram of the organic electro luminescence display device taken along the lines I-I' and II-II' shown in FIG. 2.

FIG. 1 is a perspective view representing a related art organic EL display device, FIG. 2 is a plane view specifically representing an A area of FIG. 1, and FIG. 3 is a sectional diagram of the organic EL display device taken along the lines I-I' and II-II' of FIG. 2.

The organic El display device shown in FIGS. 1 to 3 is formed on a substrate 2 for an anode electrode 4 and a cathode electrode 12 to cross each other.

A plurality of anode electrodes 4 are formed on the substrate 2 to be separated from each other with a designated gap.

An opaque conductive pattern 5 is formed on one side of the anode electrode 4. The opaque conductive pattern 5 plays the role of improving the conductivity of the anode electrode 4 which is formed of a transparent conductive material such as ITO (indium tin oxide), IZO (indium zinc oxide), ITZO (indium tin zinc oxide) having high resistance. An insulating film 6 having an aperture ratio is formed in each EL cell (E) area on the substrate 2 where the anode electrode 4 and the opaque conductive pattern 5 are formed.

A barrier rib 8 is located on the insulating film 6 for separating the organic light emitting layer 10 and the cathode electrode 12 which are to be formed thereon. The barrier rib 8 is formed in a direction of crossing the anode electrode 4 and has a reverse taper structure that an upper end part has a wide width than a lower end part. An organic light emitting layer 10 is formed on the insulating film 6 where the barrier rib 8 is formed, and the cathode electrode 12 is formed by depositing an electrode material on the entire surface.

Figure 4:
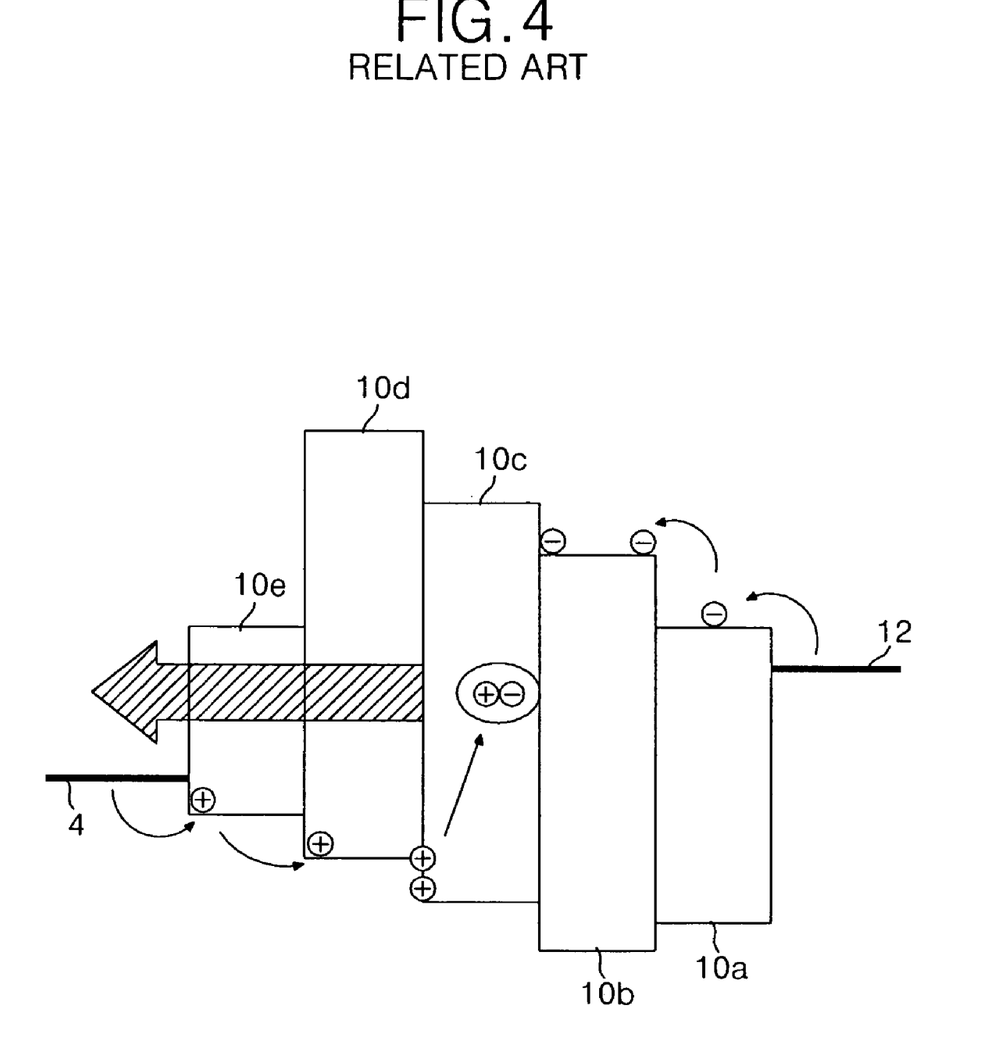
FIG. 4 is a diagram for explaining an light emitting principle of the related art organic electro luminescence display device.

The organic light emitting layer 10, as shown in FIG. 4, is formed by having a hole injection layer 10E, a hole transport layer 10D, a light emitting layer 10C, an electron transport layer 10B and an electron injection layer 10A deposited. The organic EL display device has electrons and holes emitted if a driving signal is applied to the anode electrode 4 and the cathode electrode 12, and the electron and hole emitted from the anode electrode 4 and the cathode electrode 12 are recombined within the light emitting layer 10C to generate a visible ray. At this moment, the generated visible ray exits to the outside through the anode electrode 4 to display a designated picture or image.

On the other hand, in the related art organic EL display device, there is still a problem in that the anode electrode 4 has a lower conductivity than the cathode electrode 12 which is formed of a metal of high conductivity such as aluminum AL even though the opaque conductive pattern 5 is formed for compensating the conductivity of the anode electrode 4, and the opaque conductive pattern 5 occupies part of a light emitting area P1 thus there is a problem in that the aperture ratio becomes smaller as much.

Figure 5:
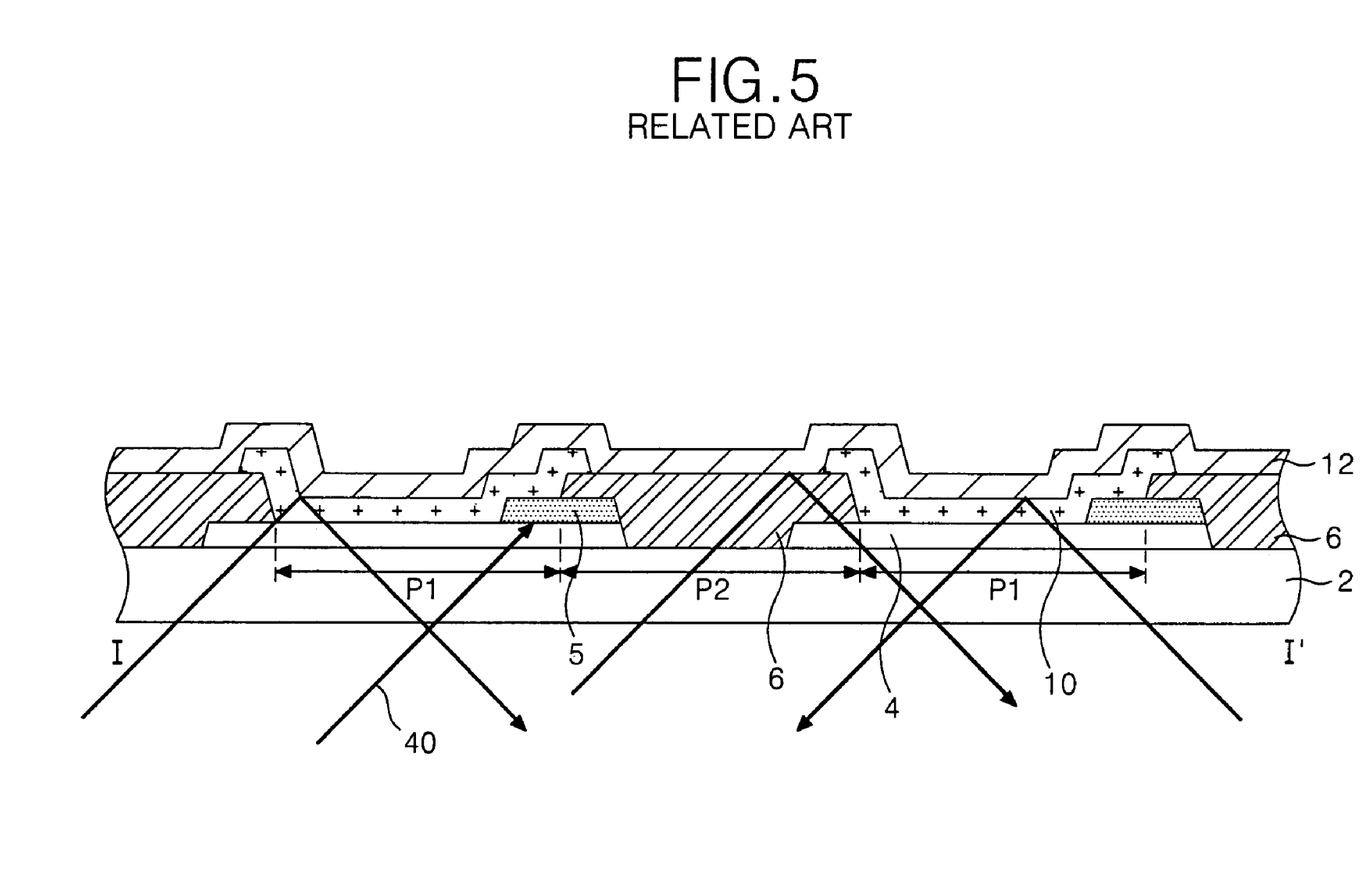
FIG. 5 is a diagram representing that an incident external light is reflected at a cathode electrode of the organic electro luminescence display device.

Further, in the related art organic EL display device, the light incident from the outside almost completely transmits the anode electrode 4 and the organic light emitting layer 10. As a result, when the light is emitted from the organic light emitting layer 10, an external light 40 being incident from the surface of the substrate 2 transmits the organic light emitting layer 10 and the anode electrode 4 of a transparent conductive material and is reflected by the cathode electrode 12 of a metal electrode, as shown in FIG. 5. Accordingly, there is a problem in that the contrast ratio is deteriorated.

SUMMARY OF THE INVENTION

Accordingly, it is an object of the present invention to provide an organic electro luminescence display device that is adaptive for improving the contrast ratio as well as improving the conductivity of an anode electrode, and a fabricating method thereof.

In order to achieve these and other objects of the invention, an organic electro luminescence display device according to an aspect of the present invention includes a plurality of anode electrodes which are disposed in parallel to a substrate, formed of a transparent conductive material and electrically separated from each other; a first conductive light shielding pattern formed along a first side of each of the anode electrodes; and a second conductive light shielding pattern formed along a second side of each of the anode electrodes.

In the organic electro luminescence display device, the first and second sides are parallel to each other, the first conductive light shielding pattern is formed to lay over the first side of the anode electrode, and the second conductive light shielding pattern is formed to lay over the second side of the anode electrode.

In the organic electro luminescence display device, the first and second conductive light shielding patterns have a remaining part in contact with the substrate except a part which lays over the anode electrode, so as to have a stepped section.

The organic electroluminescence display device further includes an insulating film which partially exposes the anode electrode to define a light emitting area; an organic light emitting layer formed in the light emitting area; and a cathode electrode formed to cross the anode electrode with the organic light emitting layer therebetween, and wherein the insulating film is formed to cover the first and second conductive light shielding pattern.

In the organic electro luminescence display device, the first and second conductive light shielding patterns include an opaque conductive material and intercept an external light.

A fabricating method of an organic electro luminescence display device according to another aspect of the present invention includes the steps of: forming a plurality of anode electrodes which are disposed in parallel to a substrate, formed of a transparent conductive material and electrically separated from each other; and forming a first conductive light shielding pattern along a first side of each of the anode electrodes and a second conductive light shielding pattern along a second side of each of the anode electrodes.

In the fabricating method, the first and second sides are parallel to each other, the first conductive light shielding pattern is formed to lay over the first side of the anode electrode, and the second conductive light shielding pattern is formed to lay over the second side of the anode electrode.

In the fabricating method, the first and second conductive light shielding patterns have a remaining part in contact with the substrate except a part which lays over the anode electrode, so as to have a stepped section.

The fabricating method further includes the steps of: forming an insulating film which partially exposes the anode electrode to define a light emitting area and covers the first and second conductive light shielding pattern; forming an organic light emitting layer in the light emitting area; and forming a cathode electrode to cross the anode electrode with the organic light emitting layer therebetween.

In the fabricating method, the first and second conductive light shielding patterns include an opaque conductive material and intercept an external light.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

With reference to FIGS. 6 to 10E, embodiments of the present invention will be explained as follows.

Figure 6:
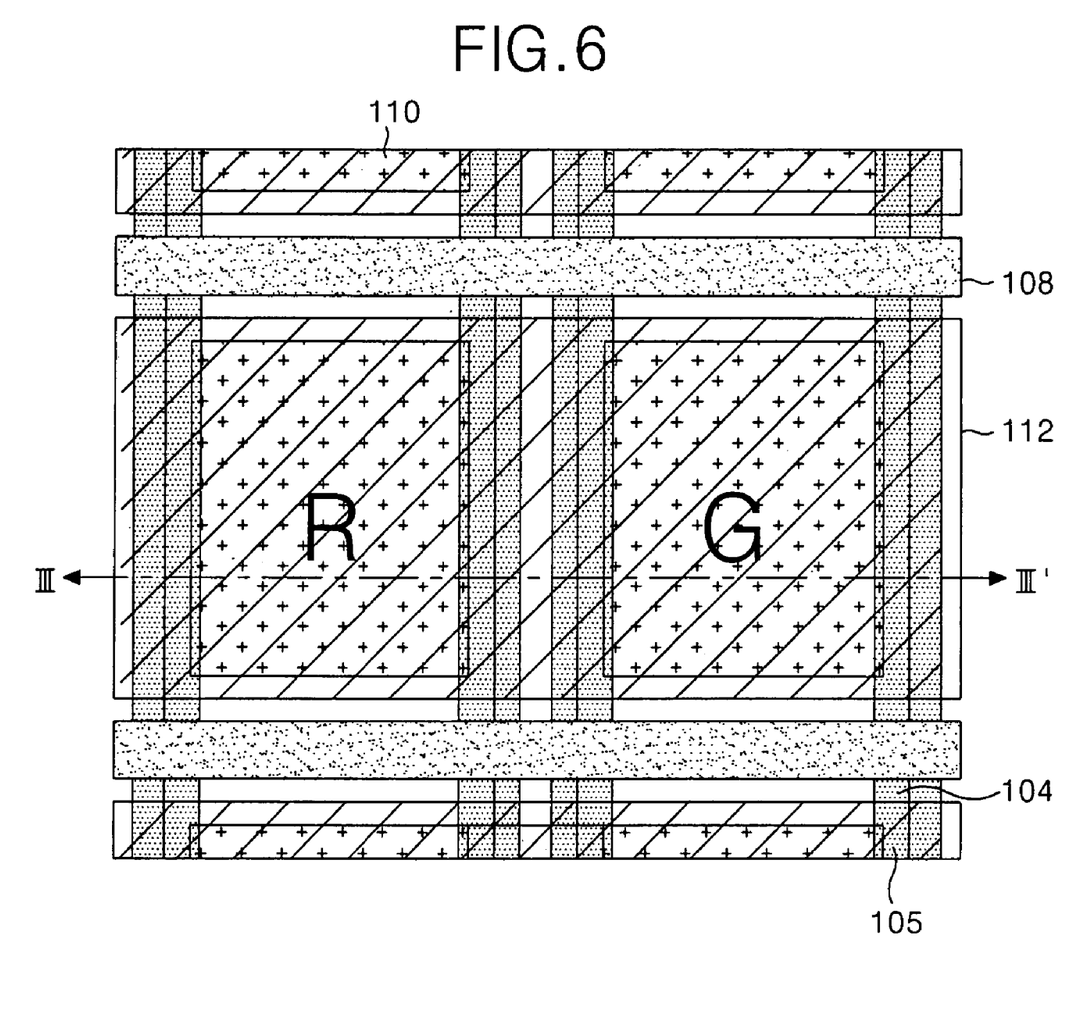
FIG. 6 is a plane view specifically representing an area of an organic electro luminescence display device according to an embodiment of the present invention.
Figure 7:
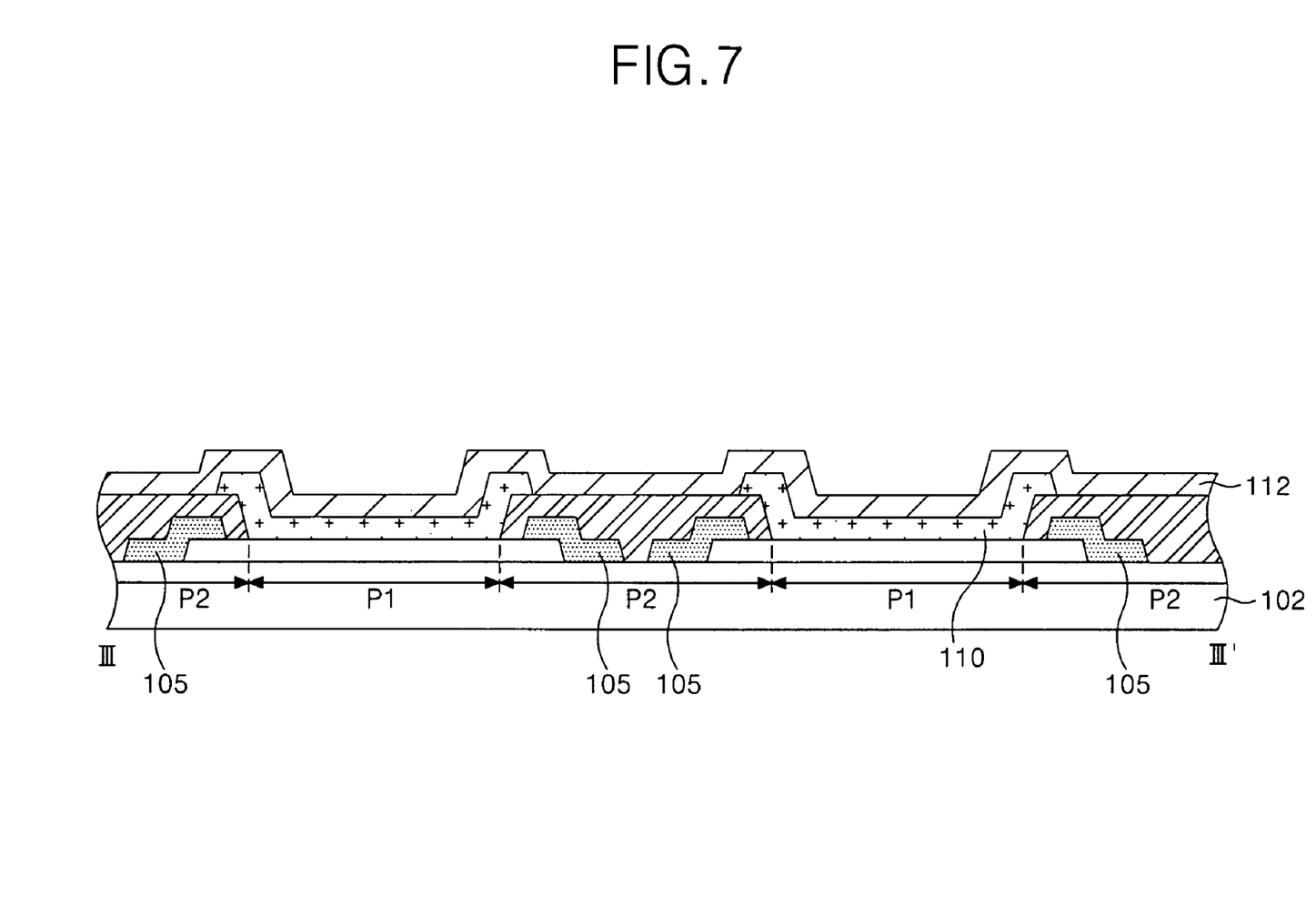
FIG. 7 is a sectional diagram taken along the line III-III' shown in FIG. 6.

FIG. 6 is a plane view representing a part of an organic EL display device according to an embodiment of the present invention, and FIG. 7 is a sectional diagram illustrating the organic EL display device taken along the lines III-III' shown in FIG. 6.

Referring to FIGS. 6 and 7, an organic EL display device includes an anode electrode 104 and a cathode electrode 112 formed to cross each other, and EL cells (E) formed for each intersection of the anode electrode 104 and the cathode electrode 112.

A plurality of anode electrodes 104 are formed on the substrate 102 to be separated with a fixed gap, and the anode electrode 104 is formed of a transparent conductive material such as ITO, IZO, ITZO which has good light transmissivity and low conductivity.

An opaque conductive pattern 105 is formed on a substrate 102 to be parallel to the anode electrode 102 and partially lay over both sides thereof, and the opaque conductive pattern 105 is formed to be covered by an insulating film 106. In other words, the opaque conductive pattern 105 is formed to lay over the both sides, i.e., left side (or first side) and right side (or second side), of the anode electrode 104. Accordingly, the conductivity of the anode electrode 104 is improved to increase its aperture ratio and contrast ratio.

Figure 8:
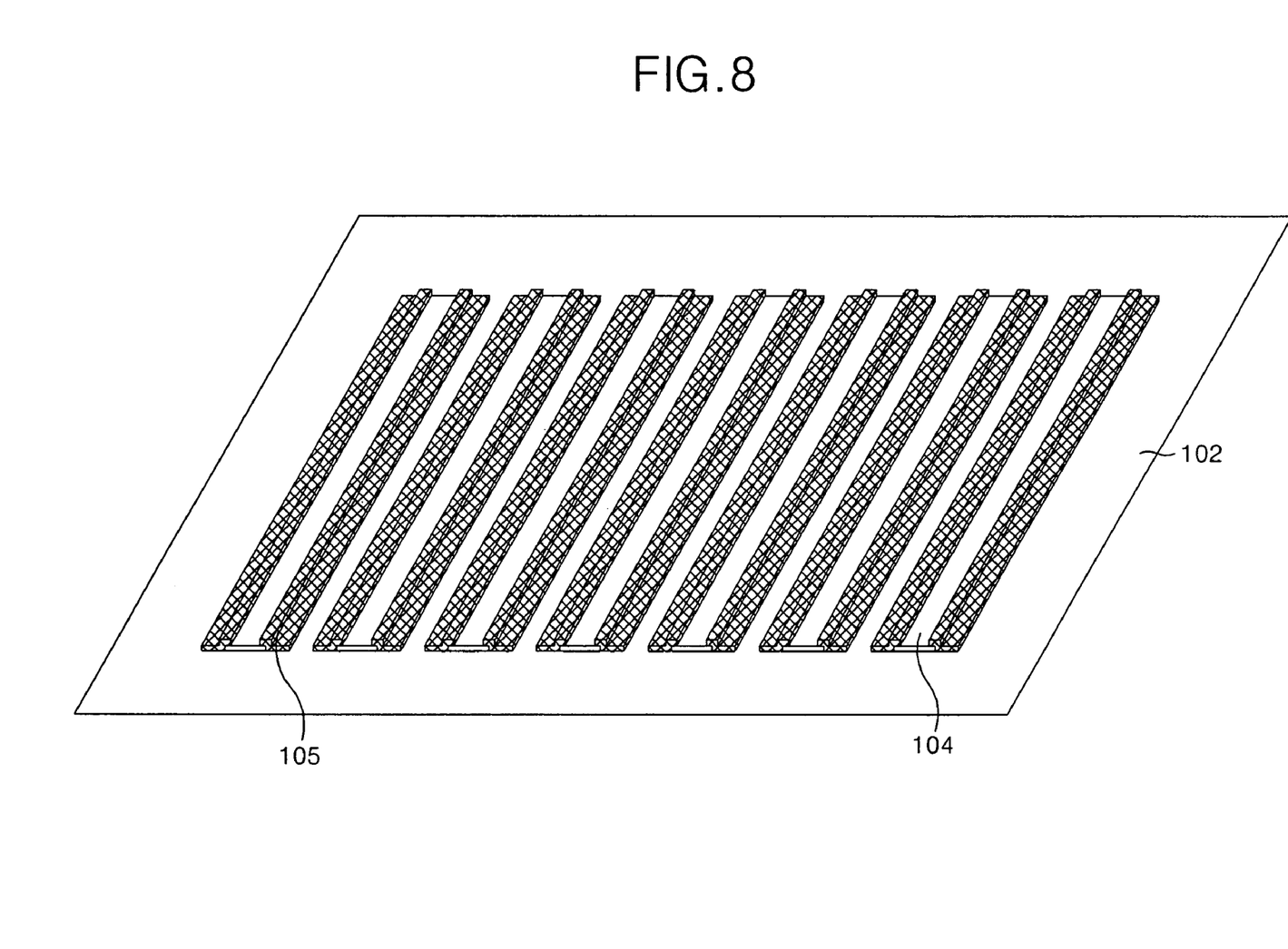
FIG. 8 is a diagram specifically representing a shape of an opaque conductive pattern shown in FIGS. 6 and 7.

Referring to FIG. 8, a detail description is made as follows.

In the present invention, the opaque conductive patterns 105 are formed to lay over the both sides of the anode electrode 104 and have a wide line width, differently from the related art. Accordingly, the conductivity of the anode electrode 104 is improved in comparison with the related art. Herein, the opaque conductive pattern 105 is formed as an independent pattern so that the anode electrodes 104 are electrically insulated from each other.

Figure 9:
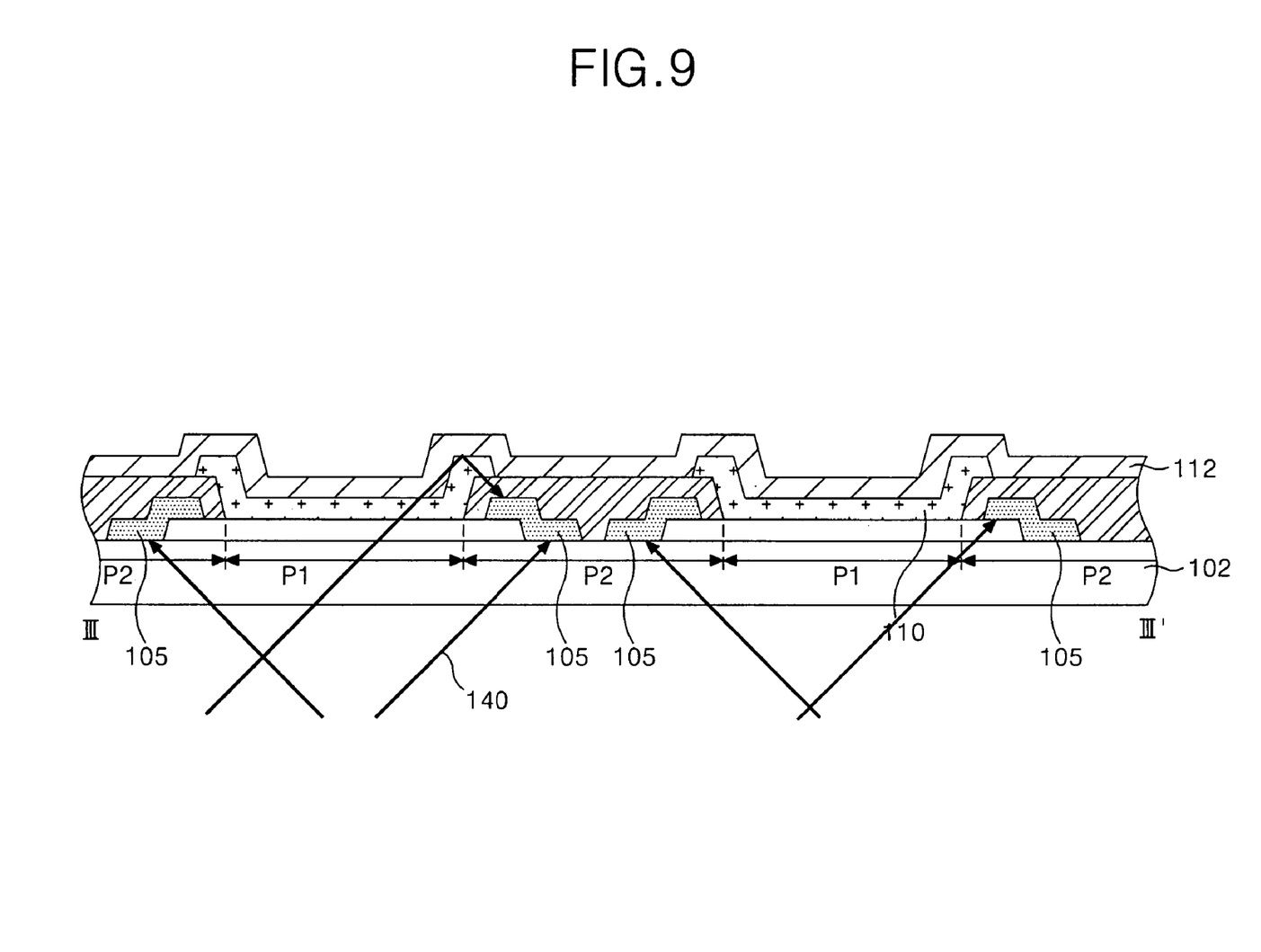
FIG. 9 is a diagram representing a light shielding role of the opaque conductive pattern; and, FIGS. 10A to 10E are diagrams representing a fabricating method of the organic electro luminescence display device shown in FIG. 7.

Further, differently from the related art, only part of the opaque conductive pattern 105 is formed to lay over the anode electrode 104 and the other part is formed to extend to a non light emitting area P2 which does not overlap the anode electrode 104. As a result, the opaque conductive pattern 105 can be formed to be covered by the insulating film 106 which is formed in the non light emitting area P2. Accordingly, the opaque conductive pattern 105 is not located on the light emitting area P1 so that the overall aperture ratio can be improved, and the opaque conductive pattern 105 is mostly located in the non light emitting area P2 so that a significant amount of external light 140 can be intercepted in comparison with the related art as shown in FIG. 9, thereby improving the contrast ratio.

The insulating film 106 formed to cover the opaque conductive pattern 105 is formed to have an aperture part which defines the light emitting area P1 for each EL cell (E) area.

On the insulating film 106, there are located a barrier rib 108 for separating the cathode electrode 112 and an organic light emitting layer 110 which is to be formed thereon. The barrier rib 108 is formed in a direction of crossing the anode electrode 104 and has a reverse taper structure that an upper end part has a wider width than a lower end part. The organic light emitting layer 110 is formed on the insulating film 106 where the barrier rib 108 is formed and the cathode electrode 112 is formed by depositing an electrode material on the entire surface. The organic light emitting layer 110 is formed by having a hole injection layer 10E, a hole transport layer 10D, a light emitting layer 10C, an electron transport layer 10B and an electron injection layer 10A deposited in the same manner as the related art.

In this way, in the organic electro luminescence display device according to the present invention, the opaque conductive pattern 105 is formed to be parallel to the anode electrode 104 and to have its part lay over the both sides of the anode electrode 104, and is formed to be electrically separated from each other so that insulation is made between the anode electrodes 104. Accordingly, an area where the opaque conductive pattern 105 is formed becomes two times as big as the related art, thereby improving the conductivity of the anode electrode 104. Further, the opaque conductive pattern 105 is not located on the light emitting area P1, and at the same time, can be located at a significant part of the non light emitting area P2, thereby improving its contrast ratio and aperture ratio.

FIGS. 10A to 10E are diagrams representing a fabricating method of the organic EL display device shown in FIG. 7, step by step.

Figure 10A:
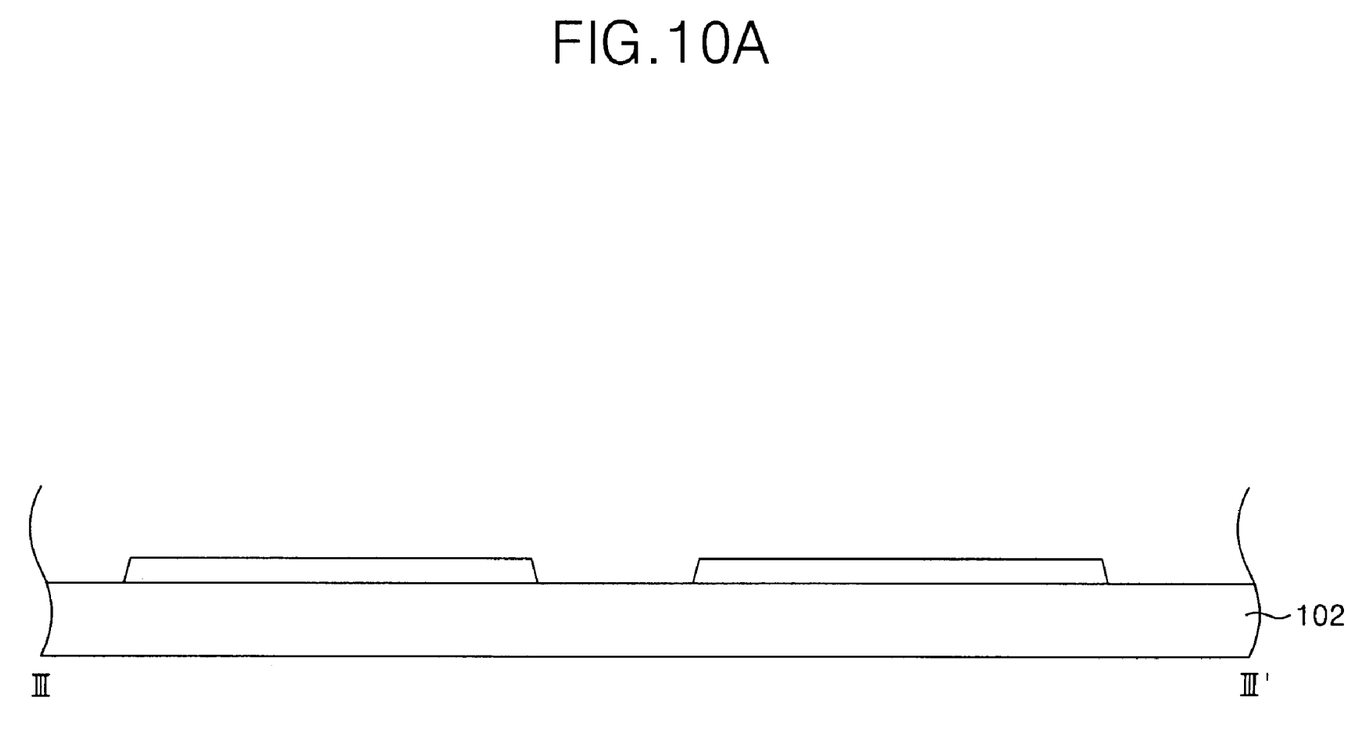

Firstly, a transparent conductive material such as ITO, IZO, ITZO and so on is deposited on the substrate 102 by use of a deposition method such as sputtering, and then the transparent conductive material is patterned by a photolithography process and an etching process, thereby forming the anode electrode 104, as shown in FIG. 10A.

Figure 10B:
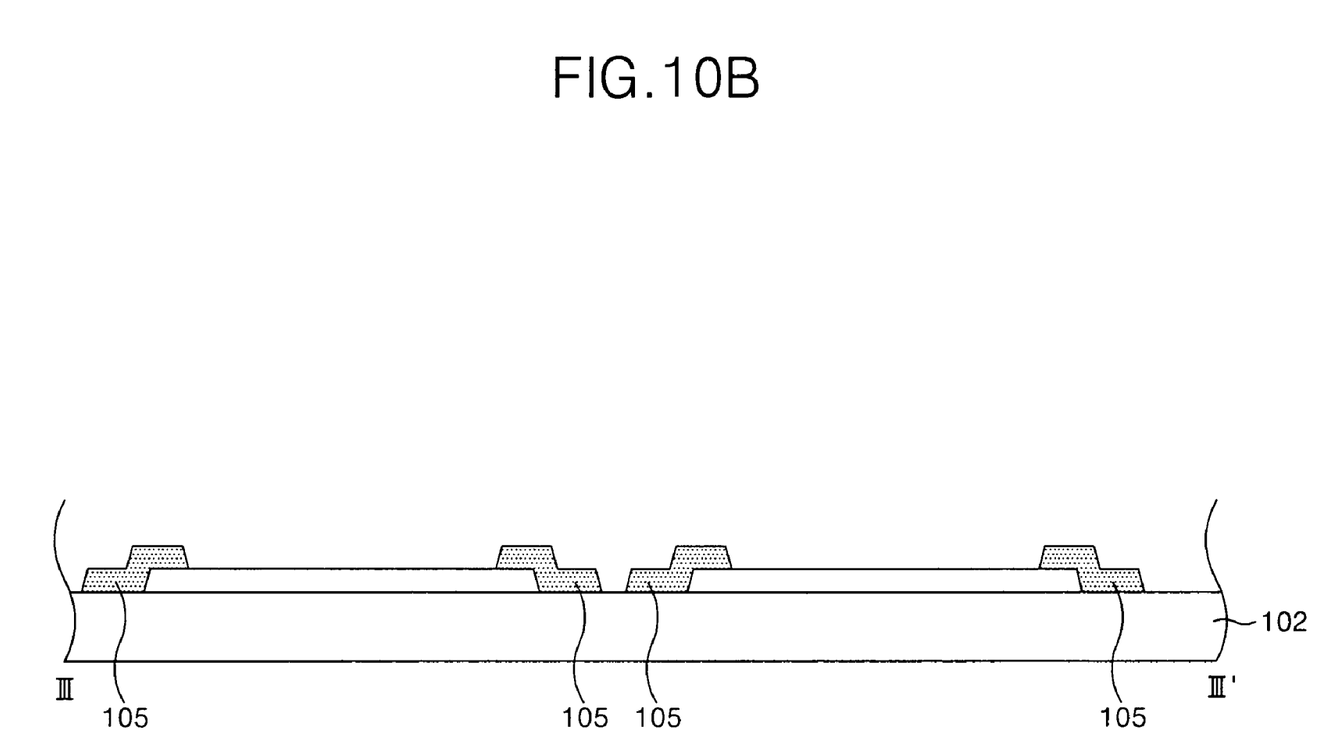

An opaque conductive material such as molybdenum Mo is formed on the substrate 102 where the anode electrode 104 is formed, and then the opaque conductive material is patterned by the photolithography process and the etching process, thereby being electrically separated from each other and forming the opaque conductive pattern 105 to lay over the both sides, i.e., the left side (or first side) and right side (or second side), of the anode electrode 104, as shown in FIG. 10B.

Figure 10C:
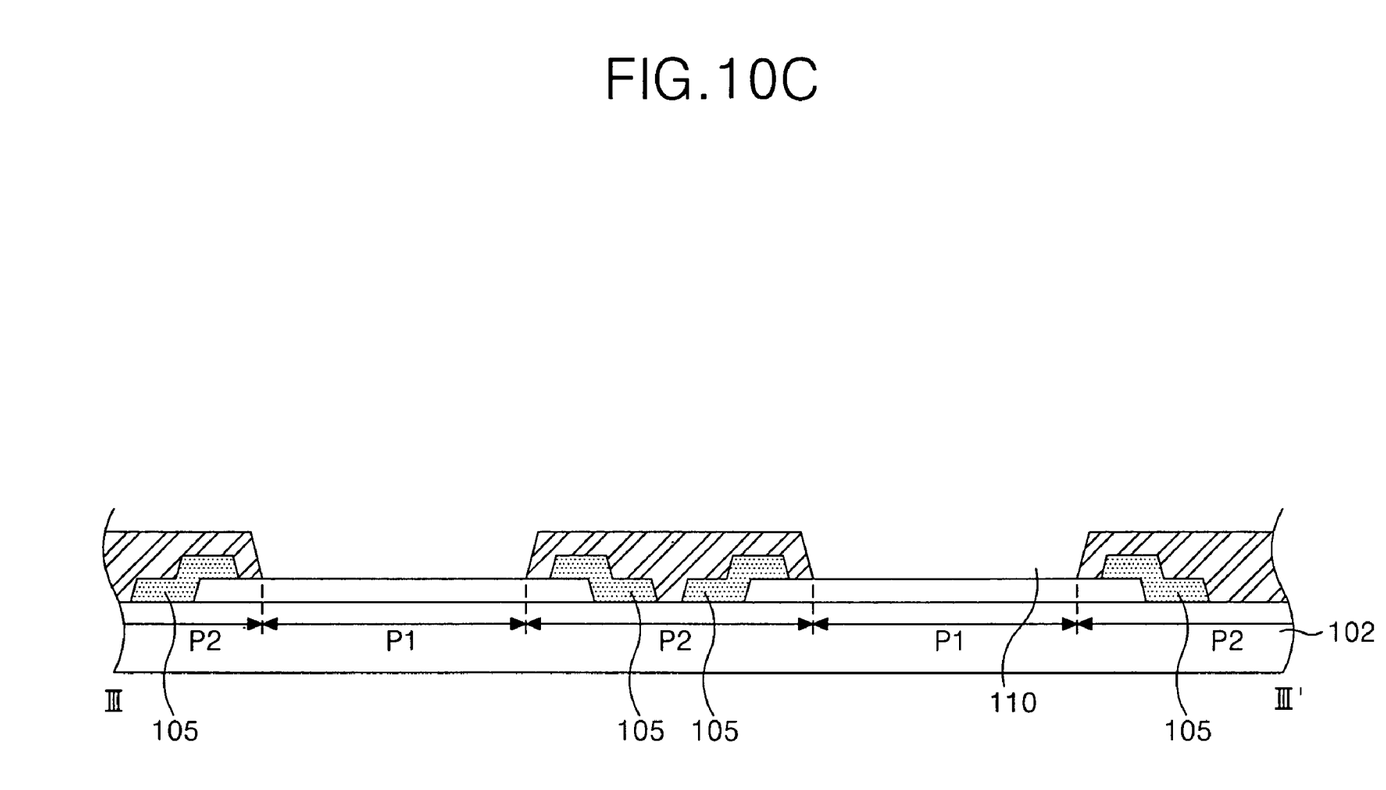

A photo sensitive insulating material is coated by a spin-coating method over the substrate 102 where the opaque conductive pattern 105 is formed, and then the photo sensitive insulating material is patterned by the photolithography process, thereby exposing the light emitting area P1 and forming the insulating film 106 to cover the opaque conductive pattern 105, as shown in FIG. 10C.

A photo sensitive organic material is deposited over the insulating material 106 and then the photo sensitive organic material is patterned by the photolithography, process, thereby forming a barrier rib.

Figure 10D:
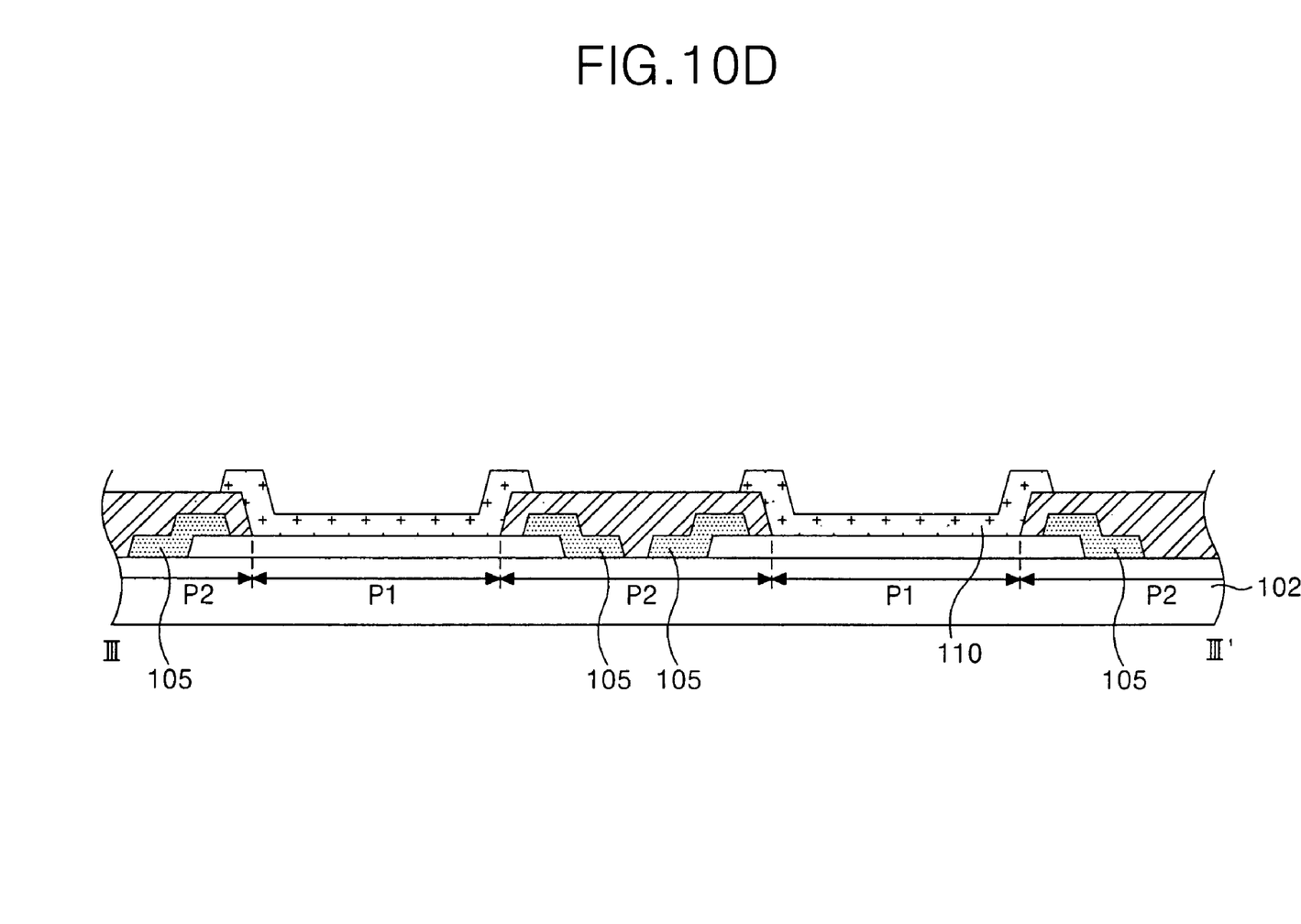

The organic light emitting layer 110, as shown in FIG. 10D, is formed on the substrate 102 where the insulating film 106 and the barrier rib 108.

Figure 10E:
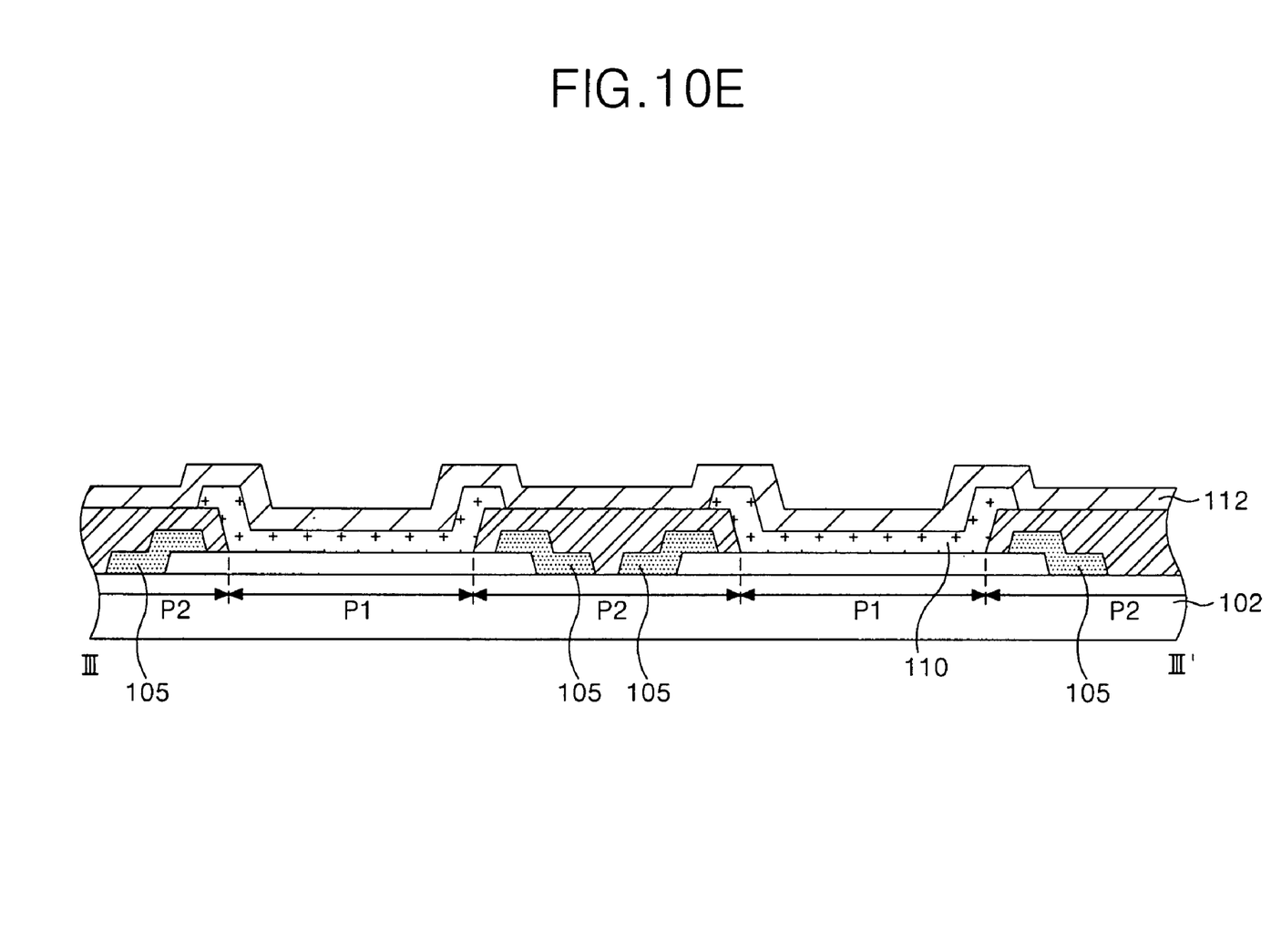

A metal material such as aluminum Al is deposited on the substrate 102 where the organic light emitting layer 110, thereby forming the cathode electrode 112, as shown in FIG. 10E.

As described above, in the organic EL display device and the fabricating method thereof according to the present invention, there is formed the opaque conductive pattern which is parallel to the anode electrode and lays over the both sides (the left side and the right side) of the anode electrode and which is electrically separated from each other for insulation to be made between the anode electrodes. Accordingly, the area where the opaque conductive pattern is to be formed becomes twice as big as the related art, thereby improving the conductivity of the anode electrode. Further, the opaque conductive pattern is not located on the light emitting area, and at the same time, is located at a significant part of the non light emitting area, thereby improving the aperture ratio and the contrast ratio at the same time.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro luminescence display device, comprising:
   a plurality of anode electrodes which are disposed in parallel lines on a substrate, formed of a transparent conductive material and electrically separated from each other;
   a first conductive light shielding pattern formed to cover partly a first side edge of the anode electrodes; and
   a second conductive light shielding pattern formed to cover partly a second side edge of the anode electrodes,
   wherein the first and second conductive light shielding patterns have a remaining part in contact with the substrate except for a part which lays over the anode electrode, and
   wherein the first and second conductive light shielding patterns are separated from each other in parallel with the anode electrode, and the first and second conductive light shielding patterns are symmetric with respect to the anode electrode.

2. The organic electro luminescence display device according to claim 1, wherein
   the first and second sides are parallel to each other;
   the first conductive light shielding pattern is formed to lay over the first side of the anode electrode, and
   the second conductive light shielding pattern is formed to lay over the second side of the anode electrode.

3. The organic electro luminescence display device according to claim 1, further comprising:
   an insulating film which partially exposes the anode electrode to define a light emitting area;
   an organic light emitting layer formed in the light emitting area; and
   a cathode electrode formed to cross the anode electrode with the organic light emitting layer therebetween,
   wherein the insulating film is formed to cover the first and second conductive light shielding pattern.

4. A fabricating method of an organic electro luminescence display device, comprising the steps of:
   forming a plurality of anode electrodes which are disposed in parallel lines on a substrate, formed of a transparent conductive material and electrically separated from each other; and
   forming a first conductive light shielding pattern to cover partly a first side edge of the anode electrodes and a second conductive light shielding pattern to cover partly a second side edge of the anode electrodes,
   wherein the first and second conductive light shielding patterns have a remaining part in contact with the substrate except for a part which lays over the anode electrode, and
   wherein the first and second conductive light shielding patterns are separated from each other in parallel with the anode electrode, and the first and second conductive light shielding patterns are symmetric with respect to the anode electrode.

5. The fabricating method according to claim 4, wherein
the first and second sides are parallel to each other,
the first conductive light shielding pattern is formed to lay over the first side of the anode electrode, and
the second conductive light shielding pattern is formed to lay over the second side of the anode electrode.

6. The fabricating method according to claim 4, further comprising the steps of:

forming an insulating film which partially exposes the anode electrode to define a light emitting area and covers the first and second conductive light shielding pattern;

forming an organic light emitting layer in the light emitting area; and forming a cathode electrode to cross the anode electrode with the organic light emitting layer therebetween.

\* \* \* \* \*